(12) United States Patent
Liu et al.

(10) Patent No.: US 7,951,651 B2
(45) Date of Patent: *May 31, 2011

(54) DUAL FLAT NON-LEADED SEMICONDUCTOR PACKAGE

(75) Inventors: Kai Liu, Mountain View, CA (US); Xiaotian Zhang, San Jose, CA (US); Ming Sun, Sunnyvale, CA (US); Leeshawn Luo, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 57 days.

This patent is subject to a terminal disclaimer.

(21) Appl. No.: 12/474,089

(22) Filed: May 28, 2009

(65) Prior Publication Data

US 2009/0233403 A1    Sep. 17, 2009

Related U.S. Application Data

(62) Division of application No. 11/029,643, filed on Jan. 5, 2005, now Pat. No. 7,456,158.

(51) Int. Cl.
   *H01L 21/00* (2006.01)
(52) U.S. Cl. .................. 438/123; 438/124; 257/E33.066
(58) Field of Classification Search .......... 438/106–127; 257/E33.066
   See application file for complete search history.

(56) References Cited

U.S. PATENT DOCUMENTS

| | | | |
|---|---|---|---|
| 6,479,327 B2 * | 11/2002 | Takahashi et al. | 438/124 |
| 6,882,047 B2 * | 4/2005 | Hata et al. | 257/734 |
| 7,781,265 B2 * | 8/2010 | Zhang et al. | 438/123 |

* cited by examiner

*Primary Examiner* — Brook Kebede
(74) *Attorney, Agent, or Firm* — James Cai; Schein & Cai LLP

(57) ABSTRACT

A DFN semiconductor package includes a leadframe having a die bonding pad formed integrally with a drain lead, a gate lead and a source lead, a die coupled to the die bonding pad, a die source bonding area coupled to the source lead and a die gate bonding area coupled to the gate lead, and an encapsulant at least partially covering the die, drain lead, gate lead and source lead.

20 Claims, 6 Drawing Sheets

US 7,951,651 B2

DUAL FLAT NON-LEADED SEMICONDUCTOR PACKAGE

CROSS-REFERENCE TO RELATED APPLICATIONS

This patent application is a divisional patent application of U.S. patent application Ser. No. 11/029,653 filed Jan. 5, 2005 now U.S. Pat. No. 7,456,158, entitled DUAL FLAT NON-LEADED SEMICONDUCTOR PACKAGE and having Kai Liu, Xiatian Zhang, Ming Sun and Leeshawn Luo listed as inventors. The disclosure of the aforementioned patent application is incorporated by reference herein.

BACKGROUND OF THE INVENTION

The present invention generally relates to semiconductor packages and more particularly to semiconductor packages and methods of making Dual Flat Non-Leaded (DFN) semiconductor packages.

Quad Flat Non-Leaded (QFN) semiconductor packages are well known in the art. QFN semiconductor packages are widely used in high pin out IC package applications. For example, a QFN semiconductor package is disclosed in U.S. patent application Publication 2002/0177254 entitled "Semiconductor Package and Method for Making the Same". The disclosed semiconductor package includes a plurality of connection pads and an embedded die. The connection pads at least partially enclose a die receiving area. An insulator is disposed in the die receiving area and the die is attached to the insulator. The die has a plurality of die bond pads. A plurality of connectors connect the die bond pads to respective connection pads. An encapsulant at least partially encapsulates the connection pads, insulator and die. The connection pads and insulator have exposed surfaces on an outer surface of the encapsulant. The exposed surfaces are substantially co-planar with the outer surface of the encapsulant. A resulting semiconductor package is shown in FIG. 1A and FIG. 1B.

It has been proposed to use DFN semiconductor packages in power MOSFET applications. In power MOSFET applications a major concern relates to thermal and electrical performance as well as to thermally induced stresses to the semiconductor package. QFN packages of the prior art do not provide the requisite thermal properties for such applications.

There is therefore a need in the art for a DFN semiconductor package having good thermal and electrical performance properties. Preferably such a DFN semiconductor package provides for an effective thermal dissipation path. Preferably such a DFN semiconductor package provides for reduced electrical resistance and inductance.

SUMMARY OF THE INVENTION

In accordance with one aspect of the invention, a DFN semiconductor package includes a leadframe having a die bonding pad formed integrally with a drain lead, a gate lead and a source lead, a die coupled to the die bonding pad, a die source bonding area coupled to the source lead and a die gate bonding area coupled to the gate lead, and an encapsulant at least partially covering the die, drain lead, gate lead and source lead.

In accordance with another aspect of the invention, a DFN semiconductor package includes a leadframe having a die bonding pad formed integrally with a drain lead, a gate lead and a source lead having an expanded area, a die coupled to the die bonding pad, a die source bonding area coupled to the source lead and a die gate bonding area coupled to the gate lead, the die bonding pad and drain lead providing a thermal dissipation path for the die, and an encapsulant covering the die, drain lead, gate lead and source lead.

In accordance with yet another aspect of the invention, a method of making a DFN semiconductor package includes the steps of forming a leadframe having a die bonding area with an integral drain lead, a gate lead and a source lead, bonding a die to the die bonding area, coupling a die source bonding area with the source lead, coupling a die gate bonding area with the gate lead, and encapsulating the die, the drain lead, the gate lead and the source lead.

There has been outlined, rather broadly, the more important features of the invention in order that the detailed description thereof that follows may be better understood, and in order that the present contribution to the art may be better appreciated. There are, of course, additional features of the invention that will be described below and which will form the subject matter of the claims appended herein.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

These and other features, aspects and advantages of the present invention will become better understood with reference to the following drawings, description and claims.

DETAILED DESCRIPTION OF THE INVENTION

The present invention generally provides a power MOSFET DFN semiconductor package exhibiting improved thermal and electrical characteristics.

Figure 1A:
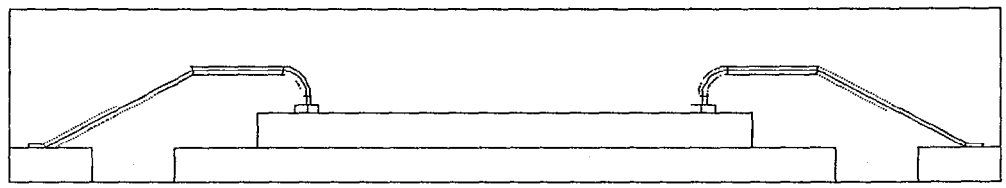
FIG. 1A is a cross sectional view of a semiconductor package of the prior art.
Figure 1B:
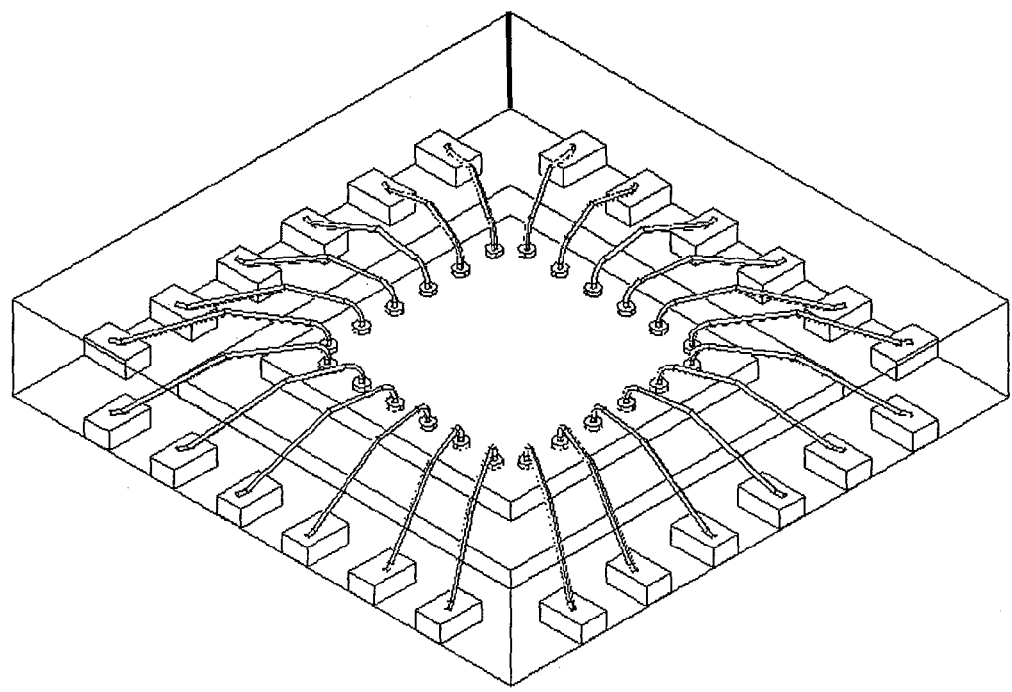
FIG. 1B is a perspective view of the semiconductor package of FIG. 1A.
Figure 2A:
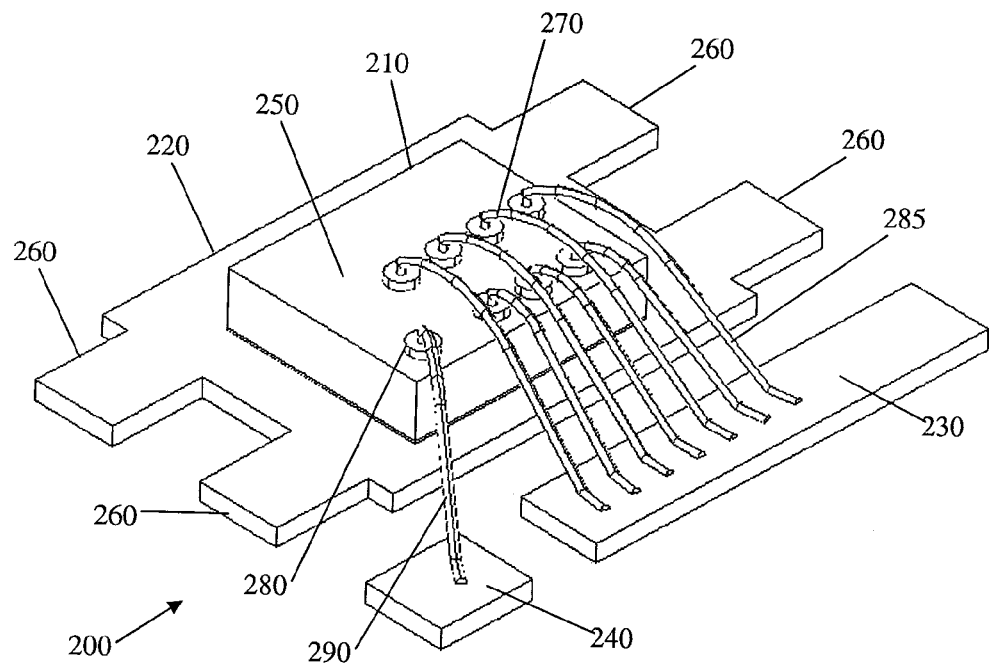
FIG. 2A is a perspective view of a leadframe for a single die package having a die attached and wire bonded thereto in accordance with the invention.
Figure 3A:
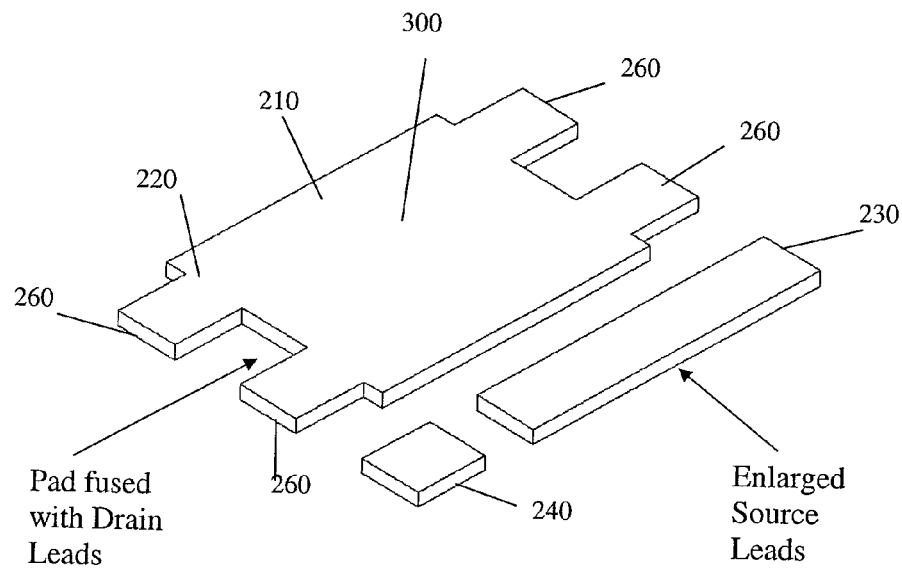
FIG. 3A is a schematic representation of a leadframe for a single die package in accordance with the invention.

In a first aspect of the invention and with reference to FIG. 2A, a DFN semiconductor package generally designated 200 may include a leadframe 210 fabricated of copper, aluminum, nickel or other good electrical and thermal conductive material. Leadframe 210 may be fabricated using metal plating or general manufacturing techniques. Leadframe 210 may include a drain portion 220 fused to drain leads 260, a source portion or lead 230 and a gate portion or lead 240. A power MOSFET die 250 may be attached to a die bonding pad 300 (FIG. 3A). Drain portion 220 may include four drain leads 260 to provide a six lead package.

Power MOSFET die 250 may include a patterned active area including a source bonding area 270 and a gate bonding area 280. A bottom portion of the power MOSFET die 250 (not shown) may include a drain bonding area.

With reference to FIG. 3A, the drain portion 220 includes the die bonding pad 300 integrally formed or fused with the drain leads 260. When the drain bonding area of the power MOSFET die 250 is attached to the die bonding pad 300 using a conductive epoxy or solder, and considering that the drain portion 220 includes an exposed bottom portion 720 (FIG. 2B), a thermal dissipation path is provided.

The source lead 230 (FIG. 2A) may be larger than in conventional semiconductor packages to enable the use of an increased number of source wires 285 which preferably are formed from gold or copper. Increasing the number of source wires 285 advantageously decreases the semiconductor package 200 resistance significantly. Additionally, as the DFN semiconductor package 200 has no external leads, the overall size of the package is reduced allowing for the use of shorter source lead 230, drain leads 260 and gate lead 240 thereby reducing package resistance and inductance.

Figure 5A:
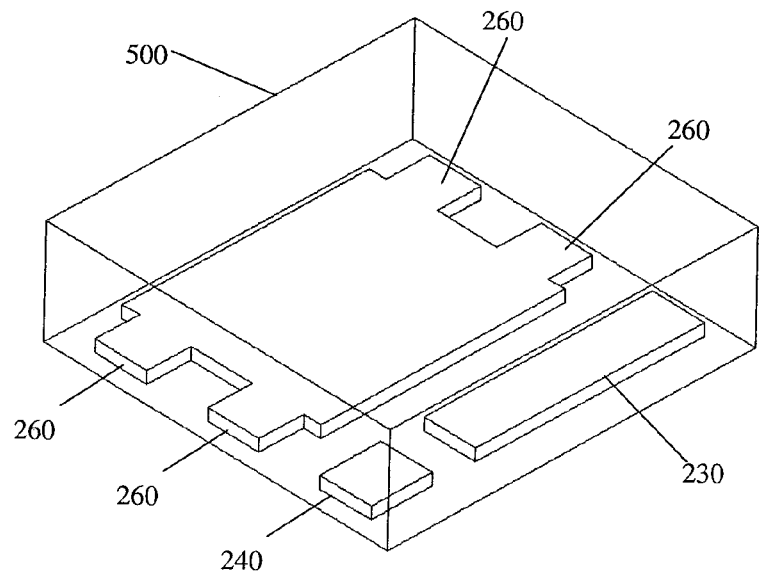
FIG. 5A is a schematic representation of a molded leadframe for a 20 single die package in accordance with the invention.
Figure 5B:
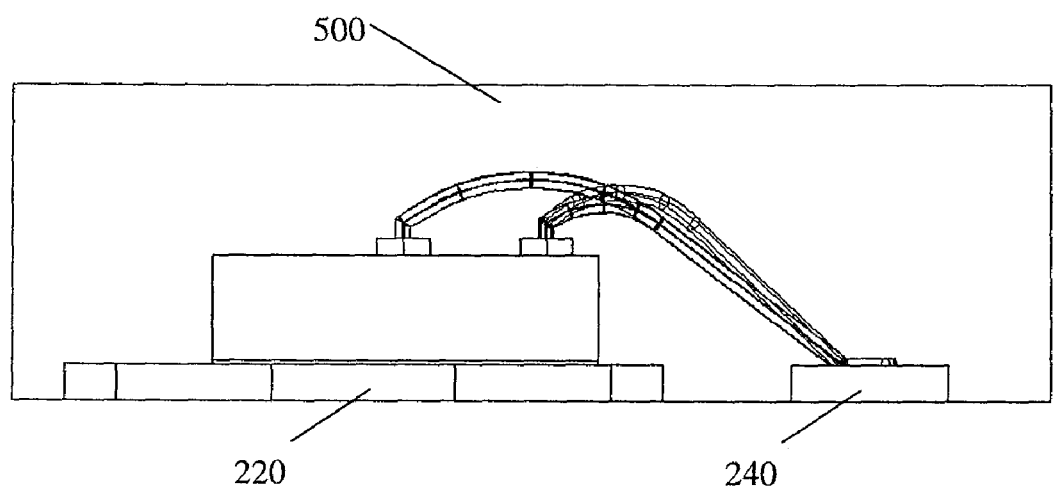
FIG. 5B is a cross sectional view of a power MOSFET package having the molded leadframe of FIG. 5A in accordance with the present invention.
Figure 6:
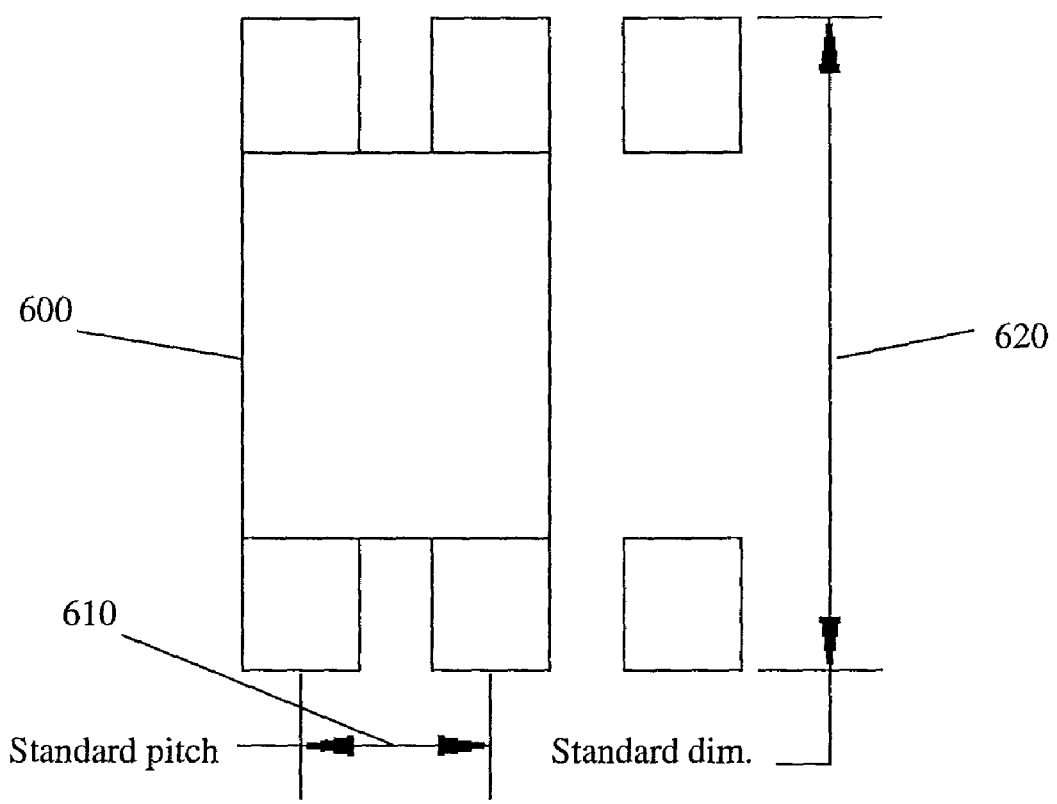
FIG. 6 is a plan view of a printed circuit board land pattern in accordance with the invention.

The leadframe 210, power MOSFET die 250 and source and gate wires 285, 290 may be encapsulated by an encapsulant 500 formed or resin or other suitable material as shown in FIG. 5. Drain leads 260, the gate lead 240 and the source lead 230 are shown disposed a distance internally of the encapsulant 500. With reference to FIG. 6, a land pattern 600 for a PCB to which the DFN semiconductor package 200 may be mounted includes a standard pitch between drain lead mounting portions 610 and a standard dimension 620. Disposing the drain leads 260, the gate lead 240 and the source lead 230 a distance from an edge of the encapsulant 500 (FIG. 5A and FIG. 5B) provides for reduced short circuiting between devices and for higher device density.

Figure 2B:
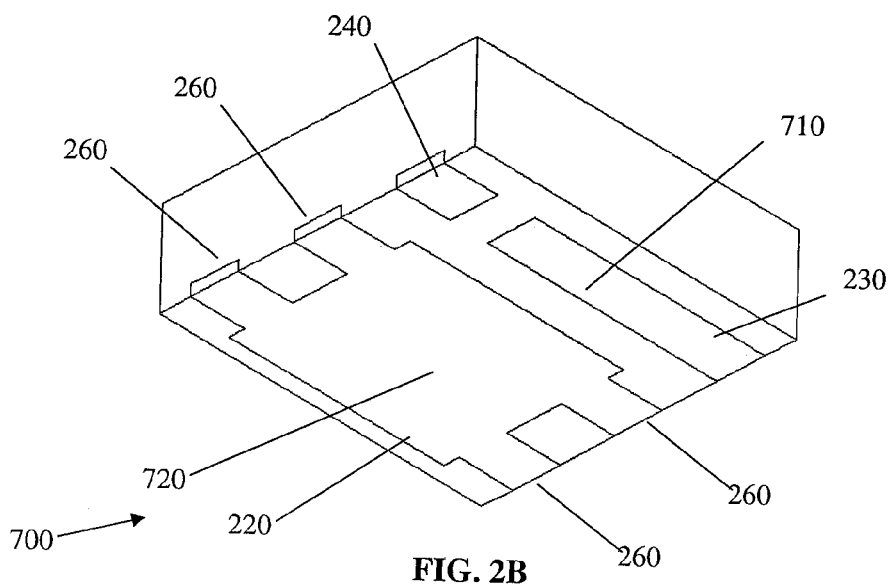
FIG. 2B is a bottom perspective view of a molded leadframe for a single die package in accordance with the invention.

In another aspect of the invention and with reference to FIG. 2B, a 15 DFN semiconductor package generally designated 700 may include the source lead 230, the gate lead 240 and the drain leads 260 disposed at an edge of an encapsulant 710.

Figure 4:
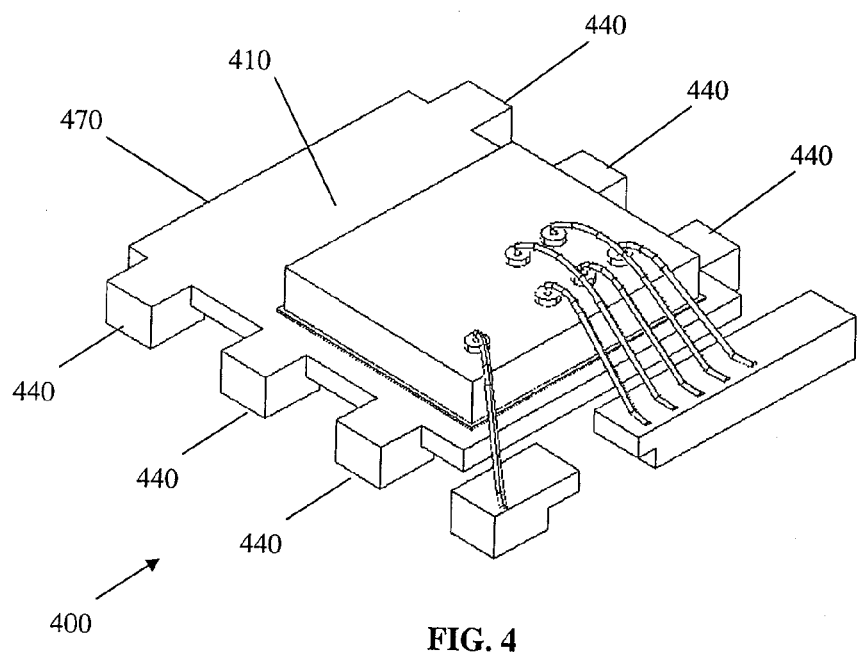
FIG. 4 is a perspective of an alternative embodiment of a leadframe for single die package having a die attached and wire bonded in accordance with the invention.

In another aspect of the invention and with reference to FIG. 4, a DFN semiconductor package generally designated 400 includes a leadframe 410 20 having an expanded drain portion 420. Expanded drain portion 420 provides for an eight lead DFN semiconductor package 400 having six drain leads 440.

Figure 3B:
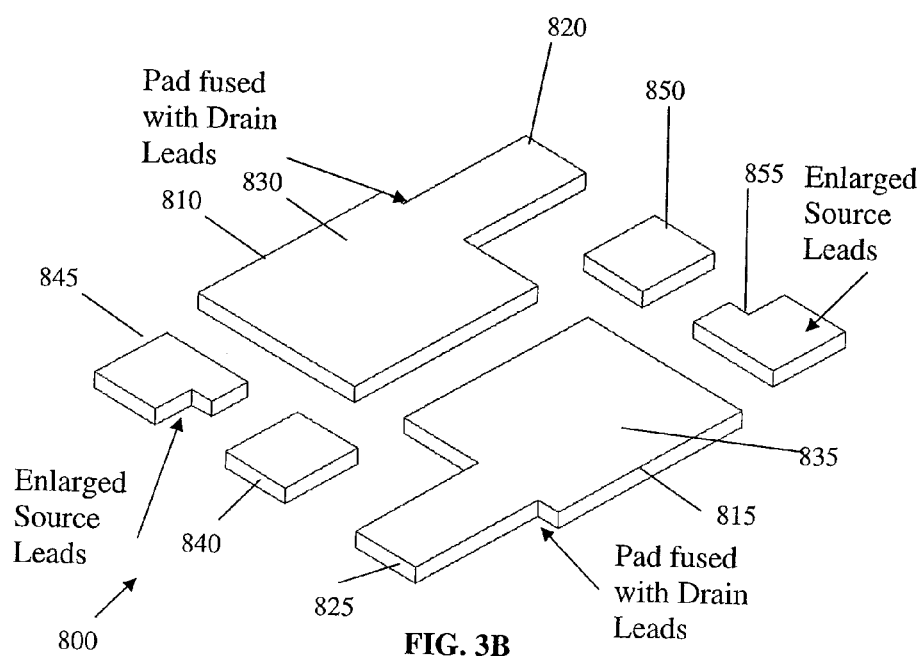
FIG. 3B is a schematic representation of a leadframe for a dual die 15 in accordance with the invention.

In another aspect of the invention and with reference to FIG. 3B, a DFN semiconductor package generally designated 800 may include a first drain portion 810 and a second drain portion 815 having drain leads 820 and 825 25 respectively. First drain portion 810 may include a first die bonding pad 830 integrally formed with the drain lead 820 and the second drain portion 815 may include a second die bonding pad 835 integrally formed with the drain lead 825. First drain portion 810 may have associated therewith a first gate lead 840 and a first source lead 845. First source lead 845 may include an expanded surface area to accommodate more source bonding wires. Second drain portion 815 may have associated therewith a second gate lead 850 and a second source lead 855. Second source lead 855 may include an expanded surface area to accommodate more source bonding wires. The first drain portion 810 and the second drain portion 815 may fused together to provide a common drain device (not shown).

The DFN semiconductor package of the invention provides for a non-leaded semiconductor package having reduced resistance and inductance and improved thermal conductivity. By providing a source lead having an expanded surface area, an increased number of source wires may be used to reduce package resistance and inductance. Integrally forming the drain bonding pad with the drain leads provides a thermal dissipation path through the bottom of the DFN semiconductor package.

It should be understood of course, that the foregoing relates to preferred embodiments of the invention and that modifications may be made without departing from the spirit and scope of the invention as set forth in the following claims.

The invention claimed is:

1. A method of making a Dual Flat Non-Leaded (DFN) semiconductor package comprising the steps of:
   forming a leadframe having a die bonding area with an integral drain lead, a gate lead and a source lead;
   bonding a power MOSFET die to the die bonding area;
   coupling a die source bonding area with the source lead;
   coupling a die gate bonding area with the gate lead; and
   encapsulating the die, the drain lead, the gate lead and the source lead by at least partially covering the die, the drain lead, the gate lead and the source lead with an encapsulant to form the Dual Flat Non-Leaded package.

2. The method of making a DFN semiconductor package according to claim 1 wherein forming the leadframe comprises forming the source lead having an expanded surface area.

3. The method of making a DFN semiconductor package according to claim 1 wherein coupling the die source bonding area to the source lead comprises using a plurality of source bonding wires.

4. The method of making a DFN semiconductor package according to claim 1 wherein the source bonding wires are gold.

5. The method of making a DFN semiconductor package according to claim 1 wherein the source bonding wires are copper.

6. The method of making a DFN semiconductor package according to claim 1 wherein encapsulating the die, the drain lead, the gate lead and the source lead comprises disposing the die, the drain lead, the gate lead and the source lead a distance away from an edge of the encapsulant.

7. A method of making a Dual Flat Non-Leaded (DFN) semiconductor package comprising the steps of:
   providing a leadframe having a die bonding area with an integral drain lead extending in a first direction and a source lead dispose along side the bonding area extending substantially parallel in the first direction;
   bonding a power MOSFET die to the die bonding area;
   coupling a die source bonding area with the source lead; and encapsulating the die, the drain lead and the source lead by at least partially covering the die, the drain lead and the source lead with an encapsulant, spacing away the source lead from a first edge of the encapsulant in a second direction transverse to the first edge.

8. The method of making a DFN semiconductor package according to claim 7 wherein the step of providing the leadframe further comprising providing a gate lead substantially aligned to the source lead in the first direction.

9. The method of making a DFN semiconductor package according to claim 8 wherein the gate lead extending to a second edge of the encapsulant transverse to the first direction.

10. The method of making a DFN semiconductor package according to claim 7 further comprising a step of coupling a die gate bonding area to the gate lead.

11. The method of making a DFN semiconductor package according to claim 7 wherein the source lead extending to a second edge of the encapsulant transversal to the first edge.

12. The method of making a DFN semiconductor package according to claim 7 wherein the drain lead extending to a second edge of the encapsulant transversal to the first edge.

13. The method of making a DFN semiconductor package according to claim 7 wherein the drain lead spacing away from the first edge of encapsulant.

14. The method of making a DFN semiconductor package according to claim 7 wherein coupling the die source bonding area to the source lead comprises using a plurality of source bonding wires.

15. The method of making a DFN semiconductor package according to claim 7 further comprising a step of coupling a die gate bonding area to the gate lead.

16. The method of making a DFN semiconductor package according to claim 7 wherein the source lead extending to a second edge of the encapsulant transversal to the first edge.

17. The method of making a DFN semiconductor package according to claim 7 wherein the drain lead extending to a second edge of the encapsulant transversal to the first edge.

18. The method of making a DFN semiconductor package according to claim 7 wherein the drain lead spacing away from the first edge of encapsulant.

19. The method of making a DFN semiconductor package according to claim 7 wherein coupling the die source bonding area to the source lead comprises using a plurality of source bonding wires.

20. A method of making a Dual Flat Non-Leaded (DFN) semiconductor package comprising the steps of:
   providing a leadframe having a die bonding area with an integral drain lead extending in a first direction and a source lead dispose along side the bonding area extending substantially parallel to the first direction and a gate lead substantially aligned to the source lead in the first direction, the gate lead extending to a second edge of the encapsulant, transverse to the first direction;
   bonding a power MOSFET die to the die bonding area;
   coupling a die source bonding area with the source lead; and
   encapsulating the die, the drain lead and the source lead by at least partially covering the die, the drain lead and the source lead with an encapsulant, spacing away the source lead from a first edge of the encapsulant in a second direction transverse to the first edge.

* * * * *